United States Patent [19]
Knobel et al.

[11] Patent Number: 5,110,669
[45] Date of Patent: May 5, 1992

[54] CONDUCTIVE POLYMER LAMINATES

[75] Inventors: Thomas M. Knobel, Hackensack, N.J.; Christian Dubouchet, Langnau Am Albis, Switzerland; Lance L. Black, Richwood, Tex.

[73] Assignee: The Dow Chemical Company, Midland, Mich.

[21] Appl. No.: 414,043

[22] Filed: Sep. 28, 1989

[51] Int. Cl.⁵ .................... B32B 27/32; B32B 15/18
[52] U.S. Cl. .................. 428/215; 428/408; 428/323; 428/412; 428/425.9; 428/428; 428/463; 428/516; 428/918; 428/922; 252/500; 206/328
[58] Field of Search ............ 428/349, 215, 516, 922, 428/458, 408, 463

[56] References Cited

U.S. PATENT DOCUMENTS

3,572,499  3/1971  Mondano .
4,363,071 12/1982  Rzepecki et al. .
4,554,210 11/1985  Long et al. .
4,590,741  5/1986  Long et al. .

Primary Examiner—P. C. Sluby

[57] ABSTRACT

A polymeric laminate and packaging material produced therefrom have (a) at least one conductive layer and (b) at least one static dissipative layer comprising a polymer composition having dispersed therein a non-volatile ionizable metal salt, said static dissipative layer being in electrical contact with the conductive layer. Such a laminate is found to provide shielding and static dissipation suitable for packaging of electrostatically sensitive items such as electronic components.

14 Claims, 3 Drawing Sheets

CONDUCTIVE POLYMER LAMINATES

BACKGROUND OF THE INVENTION

This invention relates to laminates having at least one electrically conductive layer. More specifically, it relates to such laminates additionally having at least one static dissipative layer.

With the proliferation of electronic equipment, there has developed a rapidly growing market for packaging and other materials which protect sensitive electronic components from electrostatic charges and fields. Many electronic devices, including printed circuits and microchips, are extremely vulnerable to damage from static discharges of as little as 50 volts. Static discharges on the order of 10,000 volts are commonly encountered during the normal handling of these devices such as from friction, motion, separation of dissimilar materials, and induction. It is, therefore, necessary to protect the devices from electrostatic fields and charges during their manufacture, transportation and use. Packaging and other materials used in handling or manufacturing electrostatically sensitive devices desirably protect against rapid, damaging discharges and fields. In addition to packaging, such items as storage containers, housings for electronic devices, materials used in environments in which the sensitive devices are manufactured and the like advantageously also provide such protection.

Two types of protection are advantageously provided. First, the devices are shielded from external electrostatic or radio frequency fields. Shielding can be provided by conductive films or foils, for instance, of carbon-loaded polyethylene. Carbon-loaded polymers typically have surface resistivities between about $10^3$ and $10^6$ ohms per square. Second, induced or applied electrostatic charges are attenuated or dissipated away from the devices to avoid areas of high specific charge. Films having treatments involving quaternary or tertiary amines are often used to dissipate charges. Such films typically have surface resistivities between about $10^{10}$ and $10^{13}$ ohms per square, but a somewhat more conductive material is desirable. A material as conductive as carbon loaded polyethylene or a metal is, however, so conductive that it may conduct an electrostatic charge to an electronic device before the charge can be dissipated. Such problems encountered in dealing with static are further explained by D. C. Anderson in "ESD Control: To Prevent the Spark that Kills," *Evaluation Engineering*, Vol 23, No. 7, Jul. 1984, p. 20.

Conductive laminates potentially have a number of uses. Each application involves a number of desired characteristics. A packaging material, for instance, is desirably lightweight, strong, and easily fabricated into a configuration which is adapted to the size and shape of an electronic device. While polymers, particularly polyolefins, possess the foregoing characteristics, they are not generally static dissipative or conductive without surface treatment, incorporation of a blooming additive or filling with carbon black, graphite or metallic particles. To achieve conductivity as required for shielding, a polymer must have a relatively high loading of conductive filler therein which loading is believed to provide sufficient conductive filler to achieve contact between conductive particles. In the case of carbon black, 25-40 percent by weight carbon black based on total weight of carbon black and polymer is often required. Such a highly carbon black filled polymer is referred to as carbon-loaded. Such concentrations of carbon black or other fillers typically render the polymers mechanically weak, and thus degrade some of the properties that render polymers suitable for packaging. Furthermore, loaded films are known to contaminate electronic devices by sloughing filler particles.

Layers of polymers filled with sloughable materials have been laminated between polyethylene layers to render the filled layers more manageable in a packaging process and reduce contamination by sloughing. The laminates of U.S. Pat. Nos. 4,554,210 and 4,590,741 exemplify laminates having filled layers. Such laminates, however, have relatively high surface resistivities generally characteristic of the outer layers of the laminate because the outer layers electrically insulate the inner layer. Surface resistivity can be lowered, for instance, by use of a conductive plasticizer or surface treatment on one or both outer layers as exemplified, for instance, by the laminate of U.S. Pat. No. 4,363,071.

When an amine, humectant or surfactant compound is incorporated into a polymer or used as a static dissipative surface treatment thereon, such surface treatments exude to the surface of the polymer, where they absorb atmospheric moisture to form an electrolyte microlayer. The microlayer is generally sufficiently conductive to render the polymer static dissipative. At least four major problems are encountered with static dissipative surface treatments. Since the static dissipative agents are on the surface, they are subject to being removed during handling. In this manner, the static dissipative effect is reduced or destroyed until more of the amine, humectant or surfactant can migrate to the surface. Further, since the static dissipative agent is being continually removed, the polymer will eventually lose its static dissipative properties. In addition, these static dissipative agents depend on a humid environment for effective operation. Thus, their static dissipative behavior will vary according to the local relative humidity, and will be minimal in arid environments. Finally, these static dissipative agents are sometimes corrosive or are potential contaminants.

Accordingly, it would be desirable to provide a system of polymers which has conductive and static dissipative properties which are not significantly dependent on local humidity, are stable over time, and which has physical properties which permit it to be used for a variety of packaging and other shielding and static control and conductive applications.

SUMMARY OF THE INVENTION

In one aspect, the invention is a polymeric laminate comprising
(a) at least one comprising a conductive layer and
(b) at least one static dissipative layer comprising an organic polymer having dispersed therein a non-volatile ionizable metal salt in an amount sufficient to increase the conductivity of the polymer, said layer being in electrical contact with the conductive layer.

In another aspect, the invention is a laminated, antistatic packaging material comprising:
(a) a first outer layer comprising an organic polymer having dispersed therein a non-volatile ionizable metal salt in an amount sufficient to increase the conductivity of the polymer; and
(b) in electrical contact with said first outer layer, an inner layer comprising a conductive layer.

It has been found that laminates of conductive layers and static dissipative layers in electrical contact have enhanced surface conductivity and provide effective shielding for electrostatically sensitive items. Isolation of a conductive layer used in packaging from direct contact with package contents or an environment can also be achieved by interposing a static dissipative layer or other layer between the contents and the conducting layer.

Polymer laminates and packaging materials of the invention advantageously have static dissipative and shielding properties that render them suitable for protection of electrostatically sensitive items such as electronic devices and components as well as photographic film and the like. The laminates and packaging materials of the invention, further, have static dissipative properties generally independent of humidity and which do not significantly decrease over time Advantageously, contamination by sloughing of fillers or removal of surface treatments is also reduced.

DETAILED DESCRIPTION OF THE INVENTION

Laminates of the invention have at least one instance, conductive layer. A conductive layer is generally one which conducts electricity. A conductive layer suitable for use in the practice of the invention is more conductive than a static dissipative layer in electrical contact therewith. To be sufficiently conductive to provide shielding, such conductive layers advantageously have resistivities less than about $10^5$, preferably less than about $10^4$, more preferably less than about $10^2$ ohm*cm.

Suitable conductive layers include, for instance, conductive metal plates or foils such as gold foil, copper foil, aluminum foil and the like: carbon loaded polymers, that is polymer compositions having therein sufficient carbon fillers to render the polymer composition conductive: polymers filled with electroconductive (e.g. metal, metallized, carbon, or other electroconductive) particles, including platelets, flakes, fibers, powders, granules, spheres and the like: polymer films having metallized surfaces, for instance, those treated by vacuum depositon, arc spraying and other processes of depositing a thin layer of metal on the polymer and the like. When the conductive layer is a polymer composition having conductive filler particles therein, the conductivity thereof is suitably enhanced according to the teachings of copending application Ser. No. 242,090 to Knobel et al., filed Sept. 8, 1988, which is incorporated by reference herein in its entirety.

Many conductive films or sheets are commercially available, such as, for instance carbon loaded polyolefin films from Pervel Industries, Inc. under the trade designation Condulon, ® from 3M Corporation under the trade designation Velostat ® or from Quality Packaging Supply Corporation, under the trade designation Xerostat ® and the like. Conductive layers are alternatively prepared by processes within the skill in the art. Generally when the laminate is to be used in packaging, the conductive layer is preferably a polymer composition having therein a conductive filler. For packaging of electronic components, the conductive layer preferably is of sufficient thickness to shield the components from radio frequency radiation and/or electrostatic fields, more preferably from about 1 mil to about 50 mils, most preferably from about 3 to about 10 mils. When a transparent laminate is needed, the conductive layer is preferably a metallized transparent or translucent polymer film or sheet. A metal layer is generally preferable, for instance, when the application requires attenuation of radio frequency radiation and/or electrostatic fields.

When the conductive layer has a polymeric component, any polymer with which adequate conductive material can be mixed to make the resulting polymer composition conductive is suitable. Such polymers include polyolefins such as polyethylene, polypropylene and polyisobutylene, ethylene-acrylic acid copolymers, polyesters, polyamides, polyvinylhalides, polystyrene and copolymers of styrene and other unsaturated monomers such as acrylonitrile/butadiene/styrene polymers, polycarbonates, polyurethanes, interpolymers of ethylene and carbon monoxide, polyethers, polycarbonates, ethylene-vinyl acetate copolymers, ethylene-vinyl alcohol copolymers and the like. Mixtures of these and other polymers are also suitable. A polymer is advantageously selected for its physical properties and for the ease with which it can be laminated to an adjacent layer. Those skilled in the art can select suitable polymers without undue experimentation.

In addition to the conductive layer, laminates of the invention also have at least one static dissipative layer comprising an organic polymer composition having dispersed therein a non-volatile ionizable metal salt in an amount sufficient to increase the conductivity of the polymer composition over the conductivity of the same polymer not containing the salt. Such layers are referred to herein as static dissipative layers.

The polymer composition suitably comprises any generally non-conductive, organic polymer in which an ionizable metal salt can be dispersed. A non-conductive polymer is advantageously one having a resistivity greater than about $10^{12}$ ohm·cm. Suitable polymers include polyolefins such as polyethylene, polypropylene and polyisobutylene, ethylene-acrylic acid copolymers, polyesters, polyamides, polyvinylhalides, polystyrene and copolymers of styrene and other unsaturated monomers such as acrylonitrile/butadiene/styrene polymers, polycarbonates, polyurethanes, interpolymers of ethylene and carbon monoxide, polyethers, ethylene-vinyl acetate copolymers, ethylene-vinyl alcohol copolymers and the like. Mixtures of these and other polymers are also suitable. The polymer is suitably linear or branched, but, with either structure, is preferably thermoplastic. A polymer, conductive filler and ionizable metal salt are advantageously selected for their mutual compatibility and for physical and chemical properties suitable for a specific application.

Polymers having a plurality of oxygen atoms are particularly useful in preparing polymer compositions containing ionizable metal salts, which compositions exhibit rapid static decay and are referred to herein as oxygen-containing polymers. Exemplary of oxygen-containing polymers are polyethers, particularly polytetrahydrofuran, poly(alkylene oxides), such as poly(ethylene oxide), poly(propylene oxide), poly(butylene oxide) and the like; polyesters: polyurethanes, including polyurethane-polyureas and the like; interpolymers of carbon monoxide and olefins and the like. In most instances, it is preferable that an oxygen-containing polymer contain at least about 0.01 mole fraction oxygen atoms.

For applications in which especially good static dissipative properties are desired, when fluoroalkyl sulfonic acid salts are the ionizable salts, or when the oxygen-containing polymer is to be blended with another polymer, it is preferred that the oxygen-containing polymer contain at least about 0.05, more preferably from about 0.075 to about 0.5 mole fraction oxygen, because polymers having these ranges of oxygen exhibit particularly low static decay times in the practice of the invention. In the case of interpolymers of olefins and carbon monoxide, these amounts of oxygen correspond to approximately at least about 10 weight percent, more preferably from about 15 to 45 weight percent carbonyl groups (carbon monoxide) in the polymer, respectively.

It is also preferred that the oxygen atoms be in uncharged covalent functional groups like urethane groups, ether groups or ketone groups. Functional groups like salts and acid groups which tend to have or develop a charge are somewhat less effective. Groups like esters wherein the oxygen atoms are believed to have more resonately dispersed electron density are of intermediate utility. The polymers having covalent oxygen-containing functional groups polymers are referred to herein as oxygen-rich polymers. Among the oxygen-rich polymers, polyurethanes, polyethers and carbon monoxide interpolymers with- olefins are preferred in most instances because the ionizable metal salts are often more effective in such polymers.

Ketone.-containing polymers are more preferred, in most instances, for use in the practice of the invention. Such polymers are readily prepared, for example, by the oxidation of various polyolefins. However, one preferred ketone-containing polymer is an interpolymer of a lower olefin and carbon monoxide. The term "lower olefin" is used broadly herein to refer to a mono-unsaturated acyclic hydrocarbon having from about 2 to about 12, preferably 2-6, more preferably 2-4 carbon atoms, which are either unsubstituted or substituted with heteroatoms or groups which are inert, i.e., do not undesirably interfere with the interpolymerization of the lower olefin with carbon monoxide.

The interpolymer may be a simple interpolymer of a lower olefin and carbon monoxide, or an interpolymer thereof with at least one other copolymerizable monomer, a graft or block interpolymer having at least one segment of a lower olefin/carbon monoxide interpolymer or a partially hydrogenated interpolymer. Such polymer and method of preparing them are described, for example, in U.S. Pat. Nos. 2,296,963, 2,436,269, 2,495,255, 2,495,286, 2,495,292, 2,641,590, 3,083,184, 3,248,359, 3,530,109, 3,689,460, 3,694,412, 3,780,140, 3,835,123, 3,929,727, 3,948,850, 3,948,832, 3,968,082, 3,984,388, 4,024,104, 4,024,325, 4,024,326, 4,139,522, 4,143,096 and 4,304,887, all incorporated by reference in their entireties.

Preferred carbon monoxide-containing interpolymers are random interpolymers of carbon monoxide and an unsubstituted or halogen-substituted lower olefin having 2-4 carbon atoms, preferably ethylene (including small portions of about $C_3$-$C_8$ aliphatic olefins optionally included for property modification).

When a thermoplastic carbon monoxide containing interpolymer is used, it preferably has a melt index, as measured according to ASTM D-1238, Condition E, of about 0.1 to about 500, preferably from about 2 to about 150 grams/10 minutes. A polymer having a melt index within these ranges provides optimum processing characteristics for most applications and often exhibits somewhat more conductivity than a polymer of lower melt index having therein the same ionizable salt.

Many thermoplastic polyurethanes are commercially available including Pellethane ® resins from The Dow Chemical Company, Desmopan ® resins from Bayer AG and Texin ® resins from Mobay Chemical Corporation. Other polyurethanes are prepared by methods within the skill in the art, for instance those described in U.S. Pat. Nos. 4,618,630 and 4,617,325 which are incorporated by reference herein in their entireties. Among polyurethanes, thermoplastic polyurethanes are preferred. They are advantageously the reaction products of hydroxyl-terminated relatively high equivalent weight polyether or polyester polyols, a diisocyanate and, preferably, a difunctional "chain extender". Such polyurethanes are described, for instance, in U.S. Pat. Nos. 4,748,195; 4,621,113; 4,640,949; 4,597,927; 4,306,052; 3,642,964 and copending Application Ser. No. 242,090 which are incorporated herein by reference in their entireties.

A third type of preferred oxygen-rich polymers is the polyethers. Polyethers are polymers having plural ether groups and include polyoxyalkylenes, polyacetals and the like. Commercially available polyethers suitable for use in the practice of the invention include Carbowax ® polyethylene glycols and Polyox ® resins from Union Carbide Corporation.

For most applications, the polyethers are advantageously solids, although semisolids are useful, for instance in forming electrolytes or non-structural components. Thermoformable polyethers are especially useful in the practice of the invention. They are readily amenable to manufacture of films, for instance by hot rolling or by deposition, e.g. on a support, or by solvent evaporation from a solvent.

Polyoxyalkylenes have alkylene groups alternating with oxygen atoms. Such polyethers are formed, for instance by the processes described in U.S. Pat. Nos. 3,580,866; 3,624,008; 3,627,702: 3,649,561: 3,654,183; 3,728,320; 3,728,321: 3,741,916; 3,756,968; 3,776,863; 4,303,782; 4,359,589; 4,412,063; 4,423,206 4,705,728 and copending U.S. application Ser. No. 242,090. High molecular weight polyalkylene ether glycols are also suitably coupled according to processes such as those described in U.S. Pat. Nos. 4,275,244 and 4,521,586 which are incorporated by reference herein in their entireties.

Polyoxyalkylene polyethers also include polymers having oxymethylene repeating units. The preparation of such polyethers is known in the art and includes, for instance, processes described in U.S. Pat. Nos. 3,597,397; 3,639,347; 3,754,053; 3,803,094 and 4,312,977 which are incorporated by reference herein in their entireties. In these processes oxymethylene group-containing polyethers or formaldehyde are polymerized as homopolymers or, optionally, with comonomers copolymerizable therewith.

Other polyethers suitable for use in the practice of the invention include, for instance, polyacetals. Such polymers are known in the art and include polymers produced, for instance, by the processes described in U.S. Pat. Nos. 3,883,450 and 4,380,610 which are incorporated by reference herein in their entireties.

The static dissipative layers of the laminates of the invention contain a non-volatile ionizable metal salt. By ionizable, it is meant that the salt is one which provides mobile ions in the presence of an electric field. While the ions are mobile to carry electricity, the salt advantageously remains in the polymer composition to maintain bulk or volume conductivity rather migrating to the surface of the composition. It is preferable that the salt be one which is not readily extractable from the polymers or blends thereof by contact with water or other solvent.

The cation can be any metal which forms an ionizable salt with one or more anions, including those metals in Row 2, groups IA and IIA:, Row 3, groups IA, IIA and IIIA: Row 4, groups IA-IVA and IB-VIIIB: Rows 5 and 6, groups IA-VA and IB-VIIIB; and the lanthanide series of the Periodic Table of the Elements. Preferably, the metal is an alkali metal, an alkaline earth metal, Co, Ni, Fe, Cu, Cd, Zn, Sn, Al or Ag, more preferably alkali and alkaline earth metals, most preferably alkali metals, because salts having such cations exhibit low static decay times in the practice of the invention.

The anion is one which forms an ionizable salt with the metal cation. To achieve low static decay times, the anion is advantageously one having at least one delocalizable electron, that is, it is advantageously an anion having charge distributed over more than one atom. Such an anion is recognizable by those skilled in the art by such characteristics as pi bonding, electron withdrawing groups such as halogen atoms, the possibility of resonance structures and the like. The anion is preferably a relatively large, multiatomic anion having substituents like phenyl groups, sulfur atoms, phosphorus atoms and the like that can accept and delocalize an electron charge: more preferably the anion has more than one, more preferably at least about 4, most preferably at least about 5, non-metallic atoms. Non-metallic atoms are generally considered to be selected from the group consisting of boron, carbon, silicon, phosphorus, arsenic, oxygen, sulfur, selenium, tellurium, fluorine, chlorine, bromine, iodine and astatine. Preferred non-metallic atoms are boron, phosphorus, sulfur and carbon in aromatic groups: sulfur and carbon in aromatic groups are more preferred. The anion is preferably monovalent. The anion is more preferably the conjugate base of an inorganic acid having a delocalizable electrons, a fluoroalkyl sulfonate or a tetraorganoboron ion. Such include, for example, $NO_3-$, $SCN-$, $SO_4{}^{2-}$, $HSO_4-$, $SO_3{}^{2-}$, $HSO_3-$, $ClO_4-$, $PO_4{}^{3-}$, $H_2PO_4-$, $HPO_4{}^{2-}$, $PO_3{}^{3-}$, $HPO_3{}^{2-}$, $H_2PO_3-$, fluoroalkyl sulfonic acid anions, particularly perfluoroalkyl sulfonic acid anions, tetraorganoboron ions, particularly tetraalkyl and tetraarylboron ions, and the like. The anion is most preferably not an $SCN-$ anion, when these salts tend to be water extractable, are less effective than other salts, and have a noticeable, undesirable odor and color. Similarly, most preferably, the anion is not a carboxylate or carbonate ion because salts of these anions tend to be less effective than other salts.

Among the preferred anions are fluoroalkyl sulfonic acid anions (fluoroalkyl sulfonate) which are suitably any fluoroalkyl sulfonic acid anions compatible with specific compositions in which they are used. Advantageously, for achieving static dissipation, preferred fluoroalkyl sulfonates have from about one to about twenty carbon atoms and are either straight chained, branched or cyclic. Fluoroalkyl sulfonates are sulfonate anions having an alkyl group having fluorine substitution, that is, fluorine atoms bonded to the carbon atoms of the alkyl groups. The alkyl groups, optionally, also have hydrogen atoms and/or other halogen atoms bonded to the carbon atoms. Preferably, at least about 25%, more preferably about 75%, (by number) of the atoms other than carbon which are bonded to carbon atoms of the fluoroalkyl groups are halogen, preferably fluorine. More preferably, the fluoroalkyl groups are perhaloalkyl groups, that is, alkyl groups having only halogen substitution. Suitable halogens include fluorine, chlorine, bromine and iodine, preferably fluorine and chlorine. Suitable fluoroalkyl sulfonic acid anions include, for instance, $C_2HF_4SO_3-$, $C_2HClF_3SO_3-$, $C_3H_2F_5SO_3-$, $C_4H_2F_7SO_3-$, $C_5H_2F_9SO_3-$, $C_7ClF_{14}SO_3-$, $C_8Cl_2H_2F_{13}SO_3-$, $C_{20}ClHF_{39}SO_3-$ and the like.

The fluoroalkyl groups are most preferably perfluoroalkyl groups. Exemplary perfluoroalkyl sulfonic acid anions include, for example $CF_3SO_3-$ (triflate), $C_2F_5SO_3-$, $C_5F_{11}SO_3-$, $C_7F_{15}SO_3-$, $C_8F_{17}SO_3-$, $C_9F_{19}SO_3-$, $C_{20}F_{41}SO_3-$ and the like, isomers thereof and mixtures thereof. The salts of perfluoroalkyl sulfonates preferably have from about 1 to about 20, more preferably from about 1 to about 10, carbon atoms for reasons of availability and compatibility with polymers. Within that range of perfluoroalkyl sulfonic acid salts, a salt or mixture of salts, is advantageously chosen for its compatibility with and resistance to leaching or extraction from the polymer or blend in which it is used. For instance, a mixture of perfluoroalkyl sulfonates having from about 4 to about 10 carbon atoms is most preferred for use in polyurethanes, especially for use in a polymer composition to be exposed to a moist or aqueous environment. In copolymers of ethylene and carbon monoxide and blends thereof with other polymers, however, triflates are most preferred in most instances. Exemplary salts include $NaCF_3SO_3$ (sodium triflate), $KC_6F_{13}SO_3$, $LiC_8F_{17}SO_3$, $NaC_9F_{19}SO_3$, and the like. Sodium and potassium perfluoroalkyl sulfonates having from about one to about 10 carbon atoms are most preferred.

Ferfluoroalkyl sulfonic acid salts are particularly preferred for applications in which the composition containing the salts is to be heated above about 230° F., especially when the composition is to be heated above about 300° F. Compositions containing perfluoroalkyl sulfonic acid salts often exhibit greater clarity and retain their static dissipative or conductive qualities after such heating, particularly in the presence of additives such as colorants or flame retardant additives, better than do similar compositions containing other ionizable salts.

The ionizable metal salt is dispersed in a polymer in an amount sufficient to render the polymer composition containing the salt more static dissipative than the polymer composition would be without the salt. Static dissipation can be measured using a 406C Static Decay Meter from Electro Tech Systems, Inc. or according to Federal Test Standard 101C, Method 4046, omitting the water step as in the Electronics Industry Association Interim Standard IS-5A. The time necessary to measure reduction to ±50 volts of a +5000 volt and −5000 volt charge is measured. A polymeric material is considered static dissipative if it is capable of dissipating 99% of a static charge of 5000 volts (direct current) within 30, preferably within about 10, more preferably within about 4, and most preferably within about 2 seconds or less. The more rapid times are preferred because a charge is available for possible damage for shorter times. Increased static dissipative ability is also evidenced by increased conductivity or decreased surface or volume resistivity. Conductivity is advantageously measured according to the procedure of ASTM-D-257-74 or ANS Z-41-1983. Characteristics of materials and measurement render direct correlation between measurements of static dissipation and conductivity very difficult. Increased static dissipation achieved in the practice of the invention is suitably measured by any of these methods or other methods which one skilled in the art would consider a measurement indicative of conductivity or static dissipation.

Amounts of non-volatile ionizable salts sufficient to render the polymer composition containing the salt more static dissipative than the polymer composition would be without the salt vary with the polymer composition and the salt used. The amounts are advantageously in the range of from about 0.003 to about 20 weight percent based on the weight of the total polymer composition in which the salt is dispersed. Preferably, about 0.03 to about 5, and more preferably about 0.3 to about 3 weight percent of the non-volatile ionizable metal salt is used to achieve rapid static dissipation. In most instances, levels below those indicated impart insufficient increase in conductive behavior to the polymer, whereas higher levels do not significantly further increase conductivity and are, therefore, unnecessary.

It is noted that, in the case of oxygen-rich polymers, particularly ketone-containing polymers, to obtain a specified increase in conductivity, the amount of salt needed varies, in most instances, inversely with the amount of carbonyl groups contained in the polymer. Accordingly, within a single type of oxygen-rich polymer, i.e. ketone-containing, urethane-containing or polyether-containing polymer, a polymer having relatively higher relative proportions of oxygen atoms, in most instances, requires less salt to achieve a desired level of conductive behavior than does another polymer having a lesser relative proportion of oxygen atoms.

Polymer compositions containing non-volatile ionizable metal salts in amounts suitable for use in the practice of the invention advantageously have resistivities of from about $10^6$ to about $10^{13}$ ohm·cm, preferably from about $10^6$ to about $10^{11}$, more preferably from about $10^6$ to about $10^{10}$ ehm·cm. Compositions having resistivities in these ranges provide successive amounts of static dissipation needed for packaging and shielding applications.

The non-volatile, ionizable metal salt is suitably incorporated into the polymer in any convenient manner. Advantageously, the salt is dispersed such that it ionizes. A particulate polymer can be mixed directly with the salt at the desired proportions and blended until the salt is dispersed into the polymer. Alternately, the salt can be blended into the melted polymer. In a preferred technique, a solution of the salt can be blended with the particulate or melted polymer, and the solvent is later removed. This process provides especially good dispersion of the salt into the polymer. The solvent employed in this last process is any in which the salt is soluble and which is readily evaporated from the polymer/salt mixture. Suitable solvents include water, acetone, methyl ethyl ketone, methyl isobutyl ketone, methanol, ethanol, butanol, dioxane and the like.

It is often preferable to use one or more enhancers with the ionizable metal salts in the practice of the invention. Enhancers are compounds which increase the conductivity of an organic polymer in the presence of said ionizable metal salt, but do not substantially increase the conductivity of said organic polymer in the absence of said ionizable metal salt. Enhancers are advantageously carboxylic acid salts, carboxylic acid esters, diphosphate or phosphate esters as taught in U.S. Pat. Nos. 4,618,630 and 4,617,325 to Knobel et al., which patents are incorporated herein by reference in their entireties. The salts and esters preferably are those of carboxylic acids having from about 6 to about 30, more preferably from about 9 to about 23 carbon atoms. The alcohol portion of the esters preferably has from about 2 to about 20, more preferably from about 2 to about 10 carbon atoms. It is preferable, in most cases, that the enhancer be one in which the non-volatile, ionizable metal salt is soluble. Additionally, an enhancer is preferably compatible with the polymer in which it is dispersed. In most instances, enhancers are not needed in oxygen-rich polymer compositions. In such compositions, enhancers are preferably substantially absent, that is, there is insufficient enhancer compound present to increase the conductivity of the polymer composition containing the ionizable salt, but the compounds may be present in amounts less than about 2 percent by weight as surfactants, for instance.

When an enhancer is used with the ionizable metal salt as a conductivity additive, the ability to disperse the conductivity additive is largely dependent on the compatibility of the enhancer and the organic polymer. It is, therefore, generally desirable to select the organic polymer and the enhancer together so that the two components are compatible. Alternatively, the conductivity additive and organic polymer can be compatibilized by use of a cosolvent or other material which compatibilizes the polymer and the conductivity additive Materials listed above for use as solvents or enhancers are examples of suitable cosolvents. An admixture of salt and enhancer, optionally with cosolvent, is incorporated into an already prepared polymer, e.g. by melt blending, extrusion or the like. Alternatively, the admixture is mixed with a polymer-forming reaction mixture or component thereof. Processes taught in U.S. Pat. Nos. 4,618,630 and 4,617,325, which are incorporated herein by reference, further exemplify incorporation of an ionizable salt and enhancer into a polymer composition.

In the laminates of the invention, a static dissipative layer preferably contains insufficient conductive filler to slough appreciably: therefore, it can protect an item from contamination and corrosion caused by sloughing of conductive particles from a conductive layer.

It is not critical how laminates of the invention are formed so long as the static dissipative layer and conductive layer are in electrical contact, that is, such that an electric charge is conducted from one layer to the other. Advantageously, electrical contact is established by having the layers in direct physical contact. Alternatively, there may be an intermediate layer or coating, i.e. an adhesive or tielayer, between the layers, so long as the intermediate layer is of a composition and thickness which permits current to pass between the conductive layer and the static dissipative layer. An intermediate layer can, for instance, be sufficiently thin to permit tunnelling for the intermediate layer may cover only part of the area between the static dissipative and conductive layers. Alternatively, the intermediate layer may be conductive or static dissipative.

In general, a static dissipative layer is laminated to a conductive layer by procedures suitable for laminating polymer compositions not containing ionizable metal salts to conductive layers. Such procedures are within the skill in the art. For instance, the layers can be laminated by processes such as coextrusion, otherwise extruding one or more layers upon another layer, nipping between pressure rollers, use of adhesives, use of hot rollers and the like.

Alternatively, a static dissipative layer may be deposited as a coating on the conductive layer, especially when the polymer composition containing the ionizable salt is one which has suitable rheological properties in its molten state for application as a coating, e.g. a relatively high melt index, or is castable from a volatile solvent such as acetone, methyl ethyl ketone, methyl iso-butyl ketone, tetrahydrofuran, isopropanol, ethanol, water, methylene chloride and the like. In many applications of the laminates of the invention, such as for packaging, the static dissipative layer is advantageously at least about 0.2 mil, preferably at least about 0.5 mil thick. Such a coating is sufficient, for instance, to reduce contamination from sloughing of conductive filler particles. Deposition of the static dissipative layer as a coating, for instance, as a paint, is also advantageous when the conductive layer is sufficiently thick or hard to render other methods of lamination difficult. For instance, the conductive layer may be a shaped metal structure such as a box, and the static dissipative layer can help avoid sloughing of particles from the metal surface and avoid direct contact between the metal and items which might otherwise contact it. The layer can also provide protection from the environment without electrically insulating the box.

Alternatively, especially when only a thin layer of conductive material is desirable, the conductive layer may be applied as a coating on the static dissipative layer. For instance, a metal such as nickel, tin, zinc and the like can be sputtered onto a static dissipative layer by processes within the skill in the art. Sputtering can produce conductive layers having a thickness on the order of about 500 angstroms. Such thin layers are especially useful when a transparent laminate is desirable.

Use of coating processes which produce continuous layers or of shaping processes which maintain continuity is not necessary. For instance, discontinuities may arise, especially in thin, conductive layers, in processes, such as shaping, that may deform the layers. A static dissipative layer in electrical contact with the conductive layer permits electrical conduction in spite of the discontinuities.

The surface resistivity of a static dissipative layer laminated to a conductive layer such that there is electrical contact between the layers, is advantageously lower than the resistivity of the static dissipative layer alone or of the static dissipative layer on a relatively less conductive substrate. Such decreased resistivity is exhibited so long as the static dissipative layer has a thickness ($d_2$) such that the total resistance through the thickness of the static dissipative layer, through the conductive layer and back through the static dissipative layer is less than the resistance across the surface of the static dissipative layer. The resistance is measured by 2 electrodes a preselected distance ($d_1$) apart on the surface of the static dissipative layer. If the static dissipative layer has a resistance $R_1$ and the conductive layer has a resistance $R_2$, the thickness ($d_2$) can be determined from the equation $R_1(2d_2) + R_2d_1 = R_1(d_1)$. The maximum thickness exhibiting this effect varies with polymer, salt and, optionally enhancer, composition and is referred to herein as the 37 maximum portage thickness". The static dissipative layer is preferably thicker than the percolation distance of electrons, that is the distance through which electrons travel through a non-conductive medium. More preferably, the static dissipative layer has a thickness of greater than the percolation distance of electrons in the layer and less than the maximum portage thickness, most preferably from about 0.2 to about 50 mils.

Surface conductivity is advantageously measured according to the procedure of ASTM D-257-74 using concentric electrodes. Alternatively, it is measured according to the procedure of ANS Z-41-1983, 3.5 wherein weighted electrodes and an ohmmeter are used to measure electrical resistance from which conductivity can be calculated. Volume resistivity is measured according to the procedure of ASTM D-991-85. Increased conductivity achieved in the practice of the invention is suitably measured by either of these methods or other methods which one skilled in the art would consider a measurement indicative of conductivity.

Figure 1:
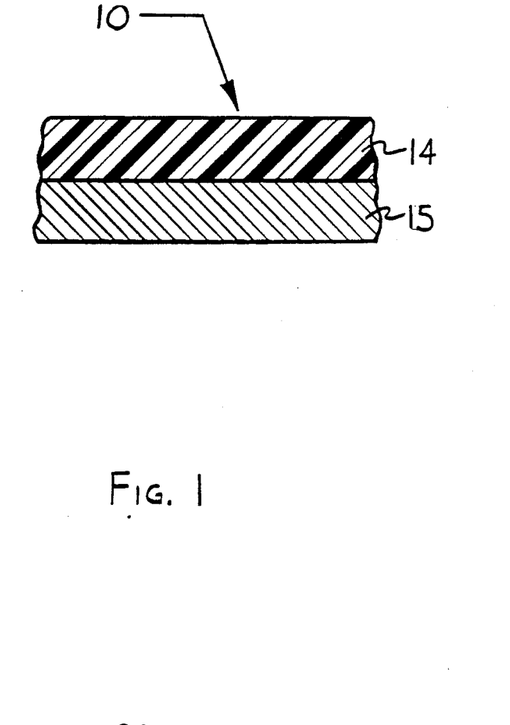
FIG. 1 represents a two layer laminate having a conductive layer and a static dissipative layer.

Laminates of the invention have at least two layers as has laminate 10 illustrated in FIG. 1, having a static dissipative layer 14 and a conductive layer 15, layer 15 being in electrical contact with said static dissipative layer 14. Such laminates are particularly useful for packaging electrostatically sensitive items. When the static dissipative layer is the inner layer (the layer nearest an object within the packaging), it provides improved static dissipative properties; and the conductive layer provides shielding. Laminates of the invention may, however, have any number of layers.

Figure 2:
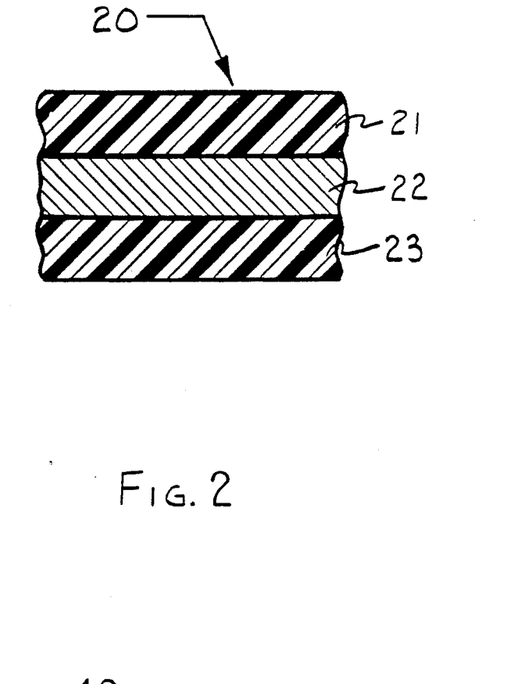
FIG. 2 represents a three layer laminate.

FIG. 2 illustrates a preferred embodiment of the invention, laminate 20, which has three layers: static dissipative layers 21 and 23; and, between and in conductive contact with said static dissipative layers 21 ad 23, conductive layer 22. Such an arrangement of laminate layers provides additional protection for an electrostatically sensitive item. Layer 21 may be identical to layer 23 or, alternatively, may differ from layer 23 by thickness, composition and/or other properties.

Figure 3:
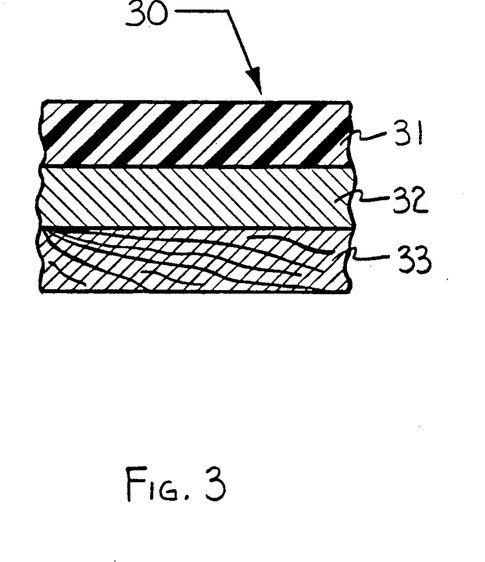
FIG. 3 represents and alternative configuration of a three layer laminate according to the practice of the invention.

FIG. 3 illustrates another embodiment of the invention having three layers. In FIG. 3, laminate 30 has static dissipative layer 31 in electrical contact with conductive layer 32. Additionally, laminate 30 has a third layer 33 which is not a static dissipative layer and, in the illustrated embodiment, is wood. The composition of layer 33 is not critical to the invention Rather than providing electrostatic protection, layer 33 advantageously provides at least one other property desirable for the laminate. For instance, in packaging, a third, non conductive is suitably of a composition and structure which provides cushioning, toughness, reinforcement, sealability, tear strength, dimensional stability, surface protection or other quality suitable for packaging. The third layer is optionally a polymer composition in the form of a film, a foam, a sheet, a shaped object or the like or is another material such as wood, cardboard, ceramic, stone or the like. In an alternative embodiment, a third layer in contact with a conductive layer may be an additional conductive layer such as a metal layer.

Figure 4:
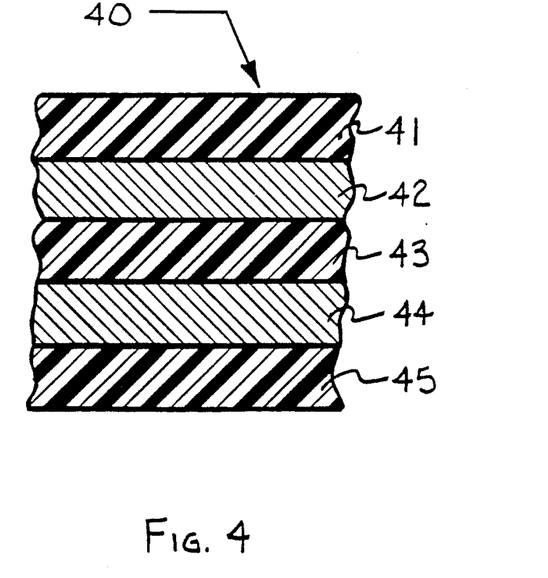
FIG. 4 represents a five layer laminate according to the practice of the invention.

Another preferred embodiment of the invention is illustrated in FIG. 4 wherein laminate 40 has 5 layers: static dissipative outer layers 41 and 45; conductive layers 42 and 44 in electrical contact with layers 41 and 45, respectively; and inner static dissipative layer 43, in electrical contact with both 42 and 44. Electrical conduction is possible throughout the laminate. Layer 43 may, optionally, additionally provide a quality desired in the laminate as outlined for the third layer in a three layer laminate as illustrated in FIG. 3. Five layer laminates are particularly useful, for instance, when at least one layer which is neither conductive nor static dissipative provides additional dimensional stability, tear strength or the like.

Figure 5:
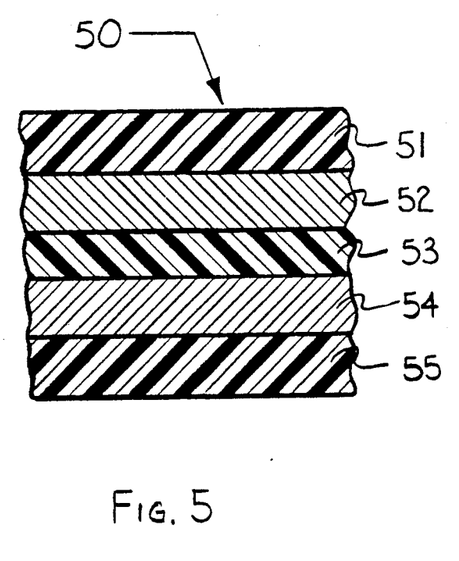
FIG. 5 represents an alternative configuration of a five layer laminate according to the practice of the invention.

FIG. 5 illustrates an alternative embodiment of the invention, laminate 50 also having 5 layers: static dissipative outer layers 51 and 55, conductive layers 52 and 54 in electrical contact with 51 and 55, respectively, and inner layer 53 which is not a static dissipative layer. Layer 53 may, optionally, provide a quality desired in the laminate as outlined for the third layer of a three layer laminate, as illustrated in FIG. 3, and has a composition as outlined for that layer. Five layer laminates are particularly useful when an inner layer provides a desirable physical property like dimensional stability or tear strength.

Laminates of sheets of relatively transparent static dissipative polymer compositions and of sheets of conductive materials having holes, openings, gaps, slits and the like (hereinafter "holey") may be formed by known processes such that there are relatively transparent portions of a laminate. Such laminates may be used to form packaging which affords some opportunity for visual inspection. Possible configurations using discontinuous conductive layers are illustrated in FIGS. 6–9.

Figure 6:
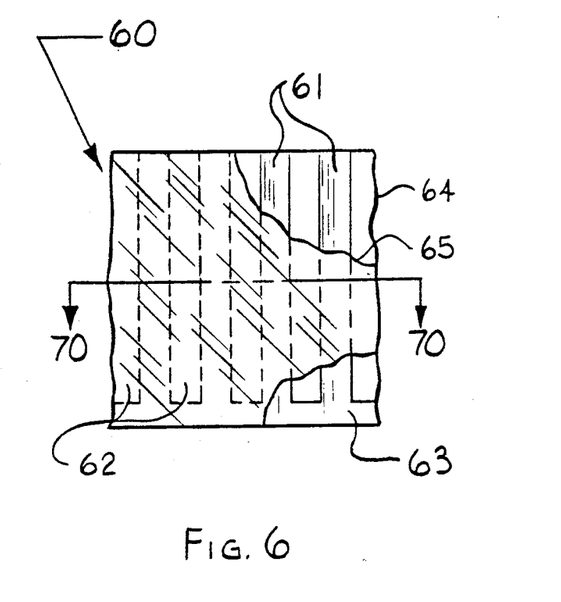
FIG. 6 represents a top view, partially in section of a configuration of a laminate of the invention wherein the conductive layer is discontinuous and the static dissipative layer is relatively transparent.

In FIG. 6, a laminate 60 has a holey conductive layer in the form of stripes 61. Laminated over and under the holey conductive layer are relatively transparent static dissipative layers 64 and 65. Between the stripes 61, the static dissipative layers are laminated to one another in the areas designated 62. To maintain conductivity through the layer, the stripes are preferably joined in a region 63. Alternatively, stripes are sufficiently close to one another to permit conductivity.

Figure 7:
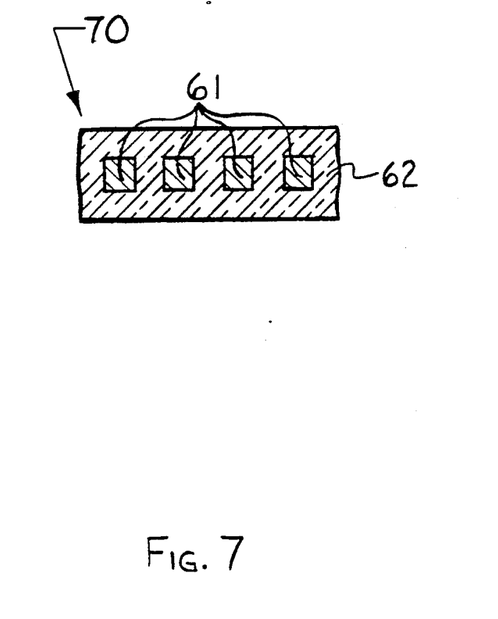
FIG. 7 represents a sectional view of the laminate of FIG. 6 taken along line 70–70.

FIG. 7 is a cross sectional view of laminate 60 taken along line 70–70. Lamination of the static dissipative layers is shown in regions 62. In an alternative embodiment, only one layer of static dissipative material is used and has the stripes of conductive material laminated thereto, preferably such that there is little movement in the relative positions of the stripes.

Figure 8:
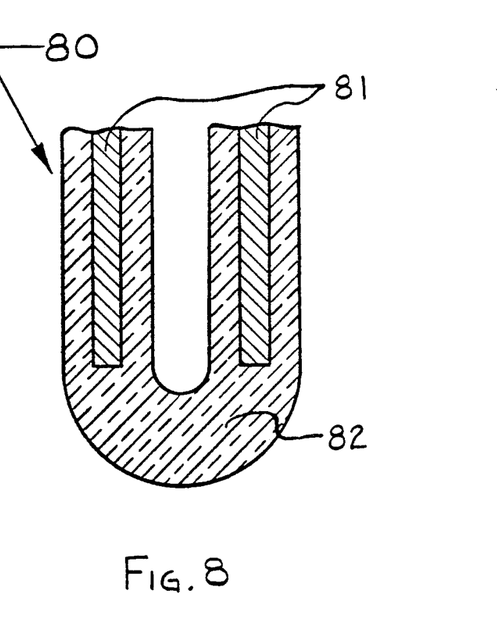
FIG. 8 represents a cross sectional view of a bag having static dissipative and conductive portions.

FIG. 8 illustrates a cross section of a bag 80 having conductive material 81 and transparent static dissipative area 82. The bag is open at the top and transparent at the bottom. Such a configuration allows optical inspection from the bottom of the bag and affords shielding along the sides of the bag.

Figure 9:
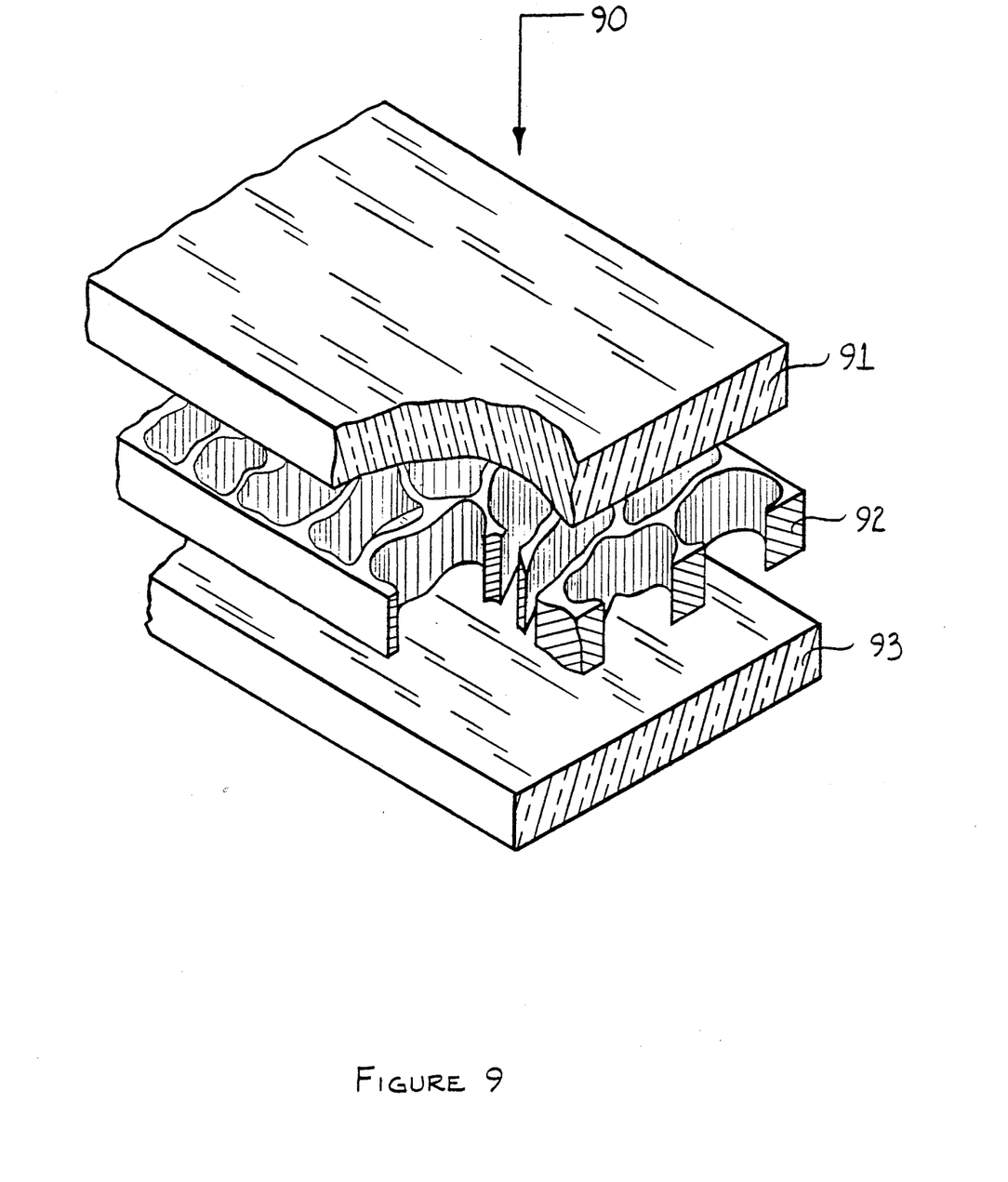
FIG. 9 represents an expanded view of another configuration of a laminate of the invention wherein the conductive layer is perforated and the static dissipative layer is relatively transparent.

FIG. 9 illustrates an expanded view of a laminate 90 having a relatively transparent static dissipative layer 91 and a holey, relatively opaque, conductive layer 72. In laminate 90 there is a third, relatively transparent layer 93. Holes in the conductive layer allow optical inspection. This configuration has the advantage of avoiding the possibility of losing electrical contact among portions of the conductive layer. The third layer 93 is optional, but is generally preferred in packaging applications to protect objects packaged such that they touch the third layer from direct contact with a conductive layer.

A laminate of the invention can be processed, fabricated or otherwise manipulated and used in the same manner as similar laminates which do not have static dissipative and conductive layers.

Packaging may be produced, for instance, according to the teachings of U.S. Pat. Nos. 4,554,210 or 4,590,741 which are incorporated herein by reference. Heat sealable polymers may be used in the static dissipative polymer compositions so that heat sealable packaging is produced. Such packaging can also be heatable and sealable using radio frequency or microwave radiation, as described in U.S. Pat. Nos. 4,600,614 and 4,601,948, which are incorporated herein by reference in their entireties. Similarly, the polymers used may be heat shrinkable.

The following examples are provided to illustrate the invention but are not intended to limit the scope thereof. All parts and percentages are by weight unless otherwise indicated. Examples (Ex.) of the invention are designated numerically, while comparative samples (C.S.) which are not examples of the invention are designated by letters. Conductivity is measured according to the procedure of ANSI Z41, part 3,5,2,2.

EXAMPLES 1 AND COMPARATIVE SAMPLE A

A blend of 0.97 weight percent sodium tetraphenyl boron (as ionizable salt) in a random interpolymer of ethylene and carbon monoxide (ECO) having 10 weight percent carbonyl groups and a melt index (M.I.) of about 10 grams per 10 minutes is prepared in a Werner-Pfleiderer ZSK-53 Twin Screw Extruder. The blend is formed by placing the ECO in the extruder and injecting a solution of 45 weight percent sodium tetraphenyl boron in methyl ethyl ketone. The solution and ECO are compounded at about 175° to 190° C. for a residence time of 20–45 seconds to form an antistatic composition. Liquid injection rates are controlled to yield blends having the indicated concentrations of sodium tetraphenyl boron.

Films 2 mils thick are blown on a gloucester film blowing unit having a 215 inch screw, a 6 inch die and a 2.3 blowing ratio. Laminate structures are prepared as follows:

Comparative Sample A.: Two of 2 mil ECO films prepared as above are pressed together with minimum heat to achieve bonding.

Example 1.: A piece of carbon-loaded polyethylene film (thickness 3.5 mil, conductivity greater than $10^5$ $(ohm-cm)^{-1}$) from Maine Poly Inc. is sandwiched between 2 pieces of ECO film prepared as above. The piece of carbon-loaded film is slightly smaller in size than the ECO sheets so that ECO to ECO contact and seal is made at the edges to avoid any direct contact of carbon-loaded polymer with measurement electrodes. A measurement electrode fits completely within the ECO film area. The sandwich is pressed together with minimum heat to produce a laminate for measurement. Samples are tested using the Electrotech 406c static decay meter following FTS 101C, method 4046.1 for resistivity, and for conductivity using ANSI 7-41 immediately at ambient conditions (20°-24° C., greater than 30% humidity) and then are retested after 114 hours at 23° C. and greater than 2% relative humidity. Results are given in Table 1.

TABLE 1

| Samples | Sodium tetraphenyl boron (wt %) | Carbon Monoxide (wt %) | Initial Charge (Volts) | Static Decay (Sec.) | Surface Resistivity (Ohms) |
|---|---|---|---|---|---|
| 0 hours. conditioned | | | | | |
| C.S.A | 1.0 | 10.0 | 0 | 0.48 | — |
| Ex. 1 | 1.0 | 10.0 | 0 | 0.02 | — |
| 114 hours. conditioned | | | | | |
| C.S.A | 1.0 | 10.0 | 0 | 0.80 | $8.4 * E11$ |
| Ex. 1 | 1.0 | 10.0 | 0 | 0.06 | $2.3 * E11$ |

The data in Table I show that the example of the invention having a conductive layer exhibits a much more rapid static decay time and a lower surface resistivity than does a sample of the polymer containing sodium tetraphenyl boron but not in electrical contact with a conductive layer.

EXAMPLES 2 AND 3 AND COMPARATIVE SAMPLE B

A sample of ECO containing 10% carbon monoxide and having a melt index of 10 g/ 10 min. and containing 5 weight percent sodium tetraphenyl boron is prepared as in Example 1 and extruded to form pellets. The pellets are pressed hydraulically to form plaques approximately 0.1 inch thick. The plaques are cut into 5 inch squares.

A control (designated Comparative Sample B) is a ECO plaque tested directly.

For Example 2 a silver-coated Mylar screen (from Deposition Technology Inc.) is sandwiched between 2 plaques avoiding overlap that would expose screen to contact with measurement electrodes. The sandwich is pressed hydraulically with heat to seal and form a laminate. There is a slight reduction in thickness of the sandwich relative to thicknesses of individual components. Resulting laminate is 0.16 inch thick.

For Example 3, a piece of aluminum foil (kitchen grade) is pressed between 2 plaques of ECO as for Example 2. After heating and pressing the laminate thickness is 0.09 inch.

Static decay and surface resistivity are measured as in Example 1: and volume resistivity, according to the procedures of ASTM D-257-74 using a Keithley Corp. Model 614 Electrometer and Model 160 Resistivity Cell. Results are shown in Table II.

TABLE II

| Sample No. | Total Thickness (inches) | Static decay (sec.) | Surface resistivity (ohms) | Volume resistivity (ohms · cm) |
|---|---|---|---|---|
| C.S.B | 0.18 | 0.01 | $1 \times 10^{11}$ | $4 \times 10^{10}$ |
| Ex. 2 | 0.18 | 0.01 | $1 \times 10^{11}$ | $6.8 \times 10^9$ |
| Ex. 3 | 0.09 | 0.01 | $2.4 \times 10^{10}$ | $1.8 \times 10^9$ |

The static decay data in Table II is the minimum measurable time for all samples. Example 2 which has relatively thick static dissipative (ECO) layers, has a surface resistivity and volume resistivity near that of Comparative Sample B which has no conductive layer. Example 3, however, has thinner static dissipative (ECO) layers and has surface and volume resistivities lower than those of Comparative Sample B and Example 2.

EXAMPLE 4

Films containing 1 weight percent sodium tetraphenyl boron are prepared as in Example 1 from ECO having 10 weight percent carbon monoxide, and with a melt index of 10 g/ 10 min.. These films are used to make 3 new laminates by the procedures outlined in Example 1. Electrical properties are measured as in Example 1 and reported in Table 111.

Comparative Sample C is prepared from 2 layers of the ECO.

Example 4 is prepared from two layers of the ECO film, each laminated to a side of a film of with Teflon ® metalized on both sides with silver commercially available from Deposition Technologies Inc.

Example 5 is prepared from two layers of ECO film, each on one side of a layer of Kaptan ® metallized with silver commercially available from Deposition Technologies Inc.

Example 6 is prepared from two layers of the ECO, having between them a silvered screen commercially available from Deposition Technologies Inc.

TABLE III

| Sample No. | Static decay time (sec.) | Surface resistivity (ohms) |
|---|---|---|
| C.S.C | 0.30 | $5.1 \times 10^{11}$ |
| Ex. 4 | 0.15 | $1.2 \times 10^{10}$ |
| Ex. 5 | 0.20 | $3.3 \times 10^9$ |
| Ex. 6 | 0.05 | $1.8 \times 10^{11}$ |

The data in Table III shows that Examples 4-6 have faster static decay times and lower surface resistivities than those of the ECO containing sodium tetraphenyl boron alone (C.S.C). Examples 4 and 5 having continuous conductive layers have lower surface resistivities than Example 6 wherein the conductive layer is a screen.

We claim:

1. A polymeric laminate comprising:
   (a) at least one conductive layer; and
   (b) at least one static dissipative layer comprising an organic polymer having dispersed therein 0.003 to 20 percent by weight of a non-volatile ionizable metal salt in an amount sufficient to increase the conductivity of the polymer, the static dissipative layer being in electrical contact with the conductive layer;

wherein the static dissipative layer is less conductive than the conductive layer, the surface resistivity of the laminate is lower than the surface resistivity of the static dissipative layer alone, the conductive layer has a resistivity of less than about $10^5$ ohm·cm, the static dissipative layer is capable of dissipating 99 percent of a static charge of 5000V within 30 seconds and the static dissipative layer has a thickness between that of the percolation distance of electrons in the static dissipative layer and the maximum portage thickness of electrons in the static dissipative layer.

2. The polymeric laminate of claim 1 further comprising (c) an additional layer which is conductive, static dissipative, or non-conductive adjacent to either or both sides of the conductive layer.

3. The polymeric laminate of claim 2 wherein the additional layer is a static dissipative layer.

4. The polymeric laminate of claim 3 wherein the additional layer is in electrical contact with the conductive layer.

5. The polymeric laminate of claim 1 further comprising (c) an additional layer which is conductive, static dissipative, or non-conductive adjacent to either or both sides of the static dissipative layer.

6. The polymeric laminate of claim 1 wherein the static dissipative layer has a resistivity of from about $10^6$ to about $10^{13}$ ohm·cm.

7. A laminated, antistatic packaging material comprising:
  (a) a first layer comprising an organic polymer having dispersed therein 0.003 to 20 percent by weight of a non-volatile ionizable metal salt in an amount sufficient to increase the conductivity of the polymer; and
  (b) in electrical contact with the first layer, a conductive layer;
wherein the static dissipative layer has a thickness between that of the percolation distance of electrons in the static dissipative layer and the maximum portage thickness of electrons in the static dissipative layer, the static dissipative layer is less conductive than the conductive layer and the surface resistivity of the laminate is lower than the surface resistivity of the static dissipative layer alone.

8. The laminated material of claim 7 wherein the static dissipative layer is an outer layer.

9. The laminated material of claim 7 wherein the static dissipative layer is an inner layer.

10. The laminated material of claim 7 wherein there is (c) an additional layer which is conductive, static dissipative, or non-conductive adjacent the conductive layer distal from the static dissipative layer.

11. The laminated material of claim 10 wherein the additional layer is a static dissipative layer.

12. The laminated material of claim 11 wherein the additional layer is in electrical contact with the conductive layer.

13. The laminated material of claim 7 further comprising (c) an additional layer which is conductive, static dissipative, or non-conductive adjacent the static dissipative layer.

14. The laminated material of claim 7 wherein the static dissipative layer is transparent and the conductive layer is discontinuous.

* * * * *